United States Patent
Rafi et al.

(10) Patent No.: US 9,490,865 B2
(45) Date of Patent: Nov. 8, 2016

(54) TRANSCEIVER SUITABLE FOR MULTIPLE POWER LEVEL OPERATION AND METHOD THEREFOR

(71) Applicant: Silicon Laboratories Inc., Austin, TX (US)

(72) Inventors: Aslamali A. Rafi, Austin, TX (US); Ravi Kummaraguntla, Austin, TX (US)

(73) Assignee: SILICON LABORATORIES, INC, Austin, TX (US)

( * ) Notice: Subject to any disclaimer, the term of this patent is extended or adjusted under 35 U.S.C. 154(b) by 0 days.

(21) Appl. No.: 15/132,984

(22) Filed: Apr. 19, 2016

(65) Prior Publication Data

US 2016/0233919 A1    Aug. 11, 2016

Related U.S. Application Data

(62) Division of application No. 14/558,173, filed on Dec. 2, 2014, now Pat. No. 9,350,412.

(51) Int. Cl.

| | |
|---|---|
| *H04B 1/44* | (2006.01) |
| *H04B 1/3805* | (2015.01) |
| *H03F 3/19* | (2006.01) |
| *H03F 3/21* | (2006.01) |

(52) U.S. Cl.
CPC ........ *H04B 1/44* (2013.01); *H03F 3/19* (2013.01); *H03F 3/211* (2013.01); *H04B 1/3805* (2013.01); *H03F 2200/451* (2013.01); *H03F 2203/21103* (2013.01)

(58) Field of Classification Search
CPC ............... H03F 2200/06; H03F 2203/45024; H03G 1/0035
See application file for complete search history.

(56) References Cited

U.S. PATENT DOCUMENTS

| | | |
|---|---|---|
| 7,081,796 B2 | 7/2006 | Krone |
| 7,973,603 B2 | 7/2011 | Kammula et al. |
| 8,280,319 B2 | 10/2012 | Kasha |
| 2013/0207872 A1 | 8/2013 | Bakalski |
| 2014/0084700 A1 | 3/2014 | Anderson |

*Primary Examiner* — David Bilodeau
(74) *Attorney, Agent, or Firm* — Polansky & Associates, P.L.L.C.; Paul J. Polansky

(57) ABSTRACT

A transceiver includes a transmit/receive terminal, a receiver input terminal, a plurality of impedance transformation networks coupled in series, a plurality of power amplifiers, and a controller. Each impedance transformation network has first and second ports. The impedance transformation networks include at least one selectable impedance transformation network having a resonant mode and a termination mode. The power amplifiers have outputs respectively coupled to the second ports of corresponding ones of the impedance transformation networks. In a receive mode, the controller selects the resonant mode for each selectable impedance transformation network and disables all power amplifiers. In a transmit mode, the controller enables a selected power amplifier and selects the resonant mode of any upstream selectable impedance transformation network, and selects the termination mode of a downstream selectable impedance transformation network.

20 Claims, 5 Drawing Sheets

TRANSCEIVER SUITABLE FOR MULTIPLE POWER LEVEL OPERATION AND METHOD THEREFOR

This application is a division of application Ser. No. 14/558,173, filed Dec. 2, 214, entitled "Transceiver Suitable for Multiple Power Level Operation and Method Therefor," invented by the inventors hereof and assigned to the assignee hereof.

FIELD OF THE DISCLOSURE

The present disclosure relates generally to radio frequency (RF) transceivers, and more particularly to front-end circuits for RF transceivers.

BACKGROUND

RF transceivers are used in a variety of modern electronics, such as smartphones, digital radios, modems, routers, printers, and internet gateways. A variety of communication standards have been recently introduced to use over-the-air RF transmission and reception capabilities for relatively short distances, including near-field communication (NFC) having a distance of about 10 centimeters, personal area networks operative from 10 to 100 meters using a protocols such as "ZigBee", "Bluetooth" and Bluetooth low energy (BTLE), and wireless local area networks such as "WiFi" having a maximum distance that varies based on conditions but under ideal conditions has been measured at over 300 meters. These standards are designed for particular purposes and generally have different power and signaling requirements. However many electronic products now support multiple ones of these standards, and providing separate circuitry for each standard increases product cost. Moreover it is difficult to design low cost, reliable transceivers using a common antenna that provide acceptable characteristics for both transmission and reception, such as appropriate transmit power level and acceptable noise figure (NF) for reception.

BRIEF DESCRIPTION OF THE DRAWINGS

The present disclosure may be better understood, and its numerous features and advantages made apparent to those skilled in the art by referencing the accompanying drawings, in which.

Figure 1:
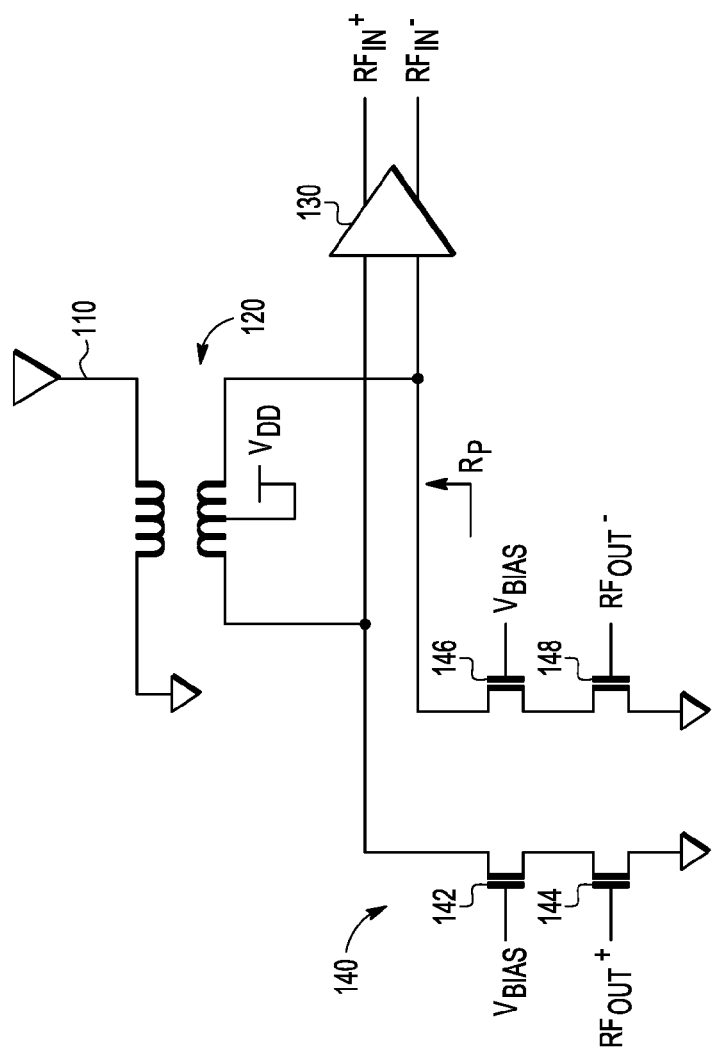
FIG. 1 illustrates in schematic form a transceiver front-end circuit known in the prior art.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

In one form, a transceiver comprises a transmit/receive terminal, a receiver input terminal, a plurality of impedance transformation networks, a plurality of power amplifiers, and a controller. The plurality of impedance transformation networks are coupled in series. Each impedance transformation network has a first port and a second port wherein the first port of a first impedance transformation network is coupled to the transmit/receive terminal and the second port of a last impedance transformation network is coupled to the receiver input terminal. The plurality of impedance transformation networks includes at least one selectable impedance transformation network having a resonant mode and a termination mode. The plurality of power amplifiers have outputs respectively coupled to the second ports of corresponding ones of the plurality of impedance transformation networks. In a receive mode, the controller selects the resonant mode for each of the at least one selectable impedance transformation network and disables all of the plurality of power amplifiers. In a transmit mode, the controller enables a selected one of the plurality of power amplifiers and selects the resonant mode of any of the at least one selectable impedance transformation network that is coupled between an output of the selected one of the plurality of power amplifiers and the transmit/receive terminal, and selects the termination mode of a first of the at least one selectable impedance transformation network coupled between an output of the selected one of the plurality of power amplifiers and the receiver input terminal.

In another form, a transceiver comprises a terminal, plurality of impedance transformation networks, a plurality of power amplifiers, and a controller. The plurality of impedance transformation networks forms a scalable impedance transformation network and includes first and second impedance transformation networks. The first impedance transformation network has a first port coupled to the terminal and a second port. The second impedance transformation network has a first port coupled to the second port of the first impedance transformation network, and a second port and having a resonant mode and a termination mode. The plurality of power amplifiers includes a first power amplifier coupled to the second port of the first impedance transformation network, and a second power amplifier coupled to the second power of the second impedance transformation network. In a first transmit mode, the controller provides a transmit signal to the terminal using the first power amplifier while placing the second impedance transformation network in the termination mode. In a second transmit mode, the controller provides the transmit signal to the terminal using the second power amplifier while placing the second impedance transformation network in the resonant mode.

In yet another form, a method includes a first transmit mode, a second transmit mode, and a receive mode. In the first transmit mode, a transmit signal is provided at a first power level, and the transmit signal is coupled to a transmit/receive terminal using a first portion of a scalable impedance network having a first characteristic impedance looking from an input of the first portion toward the transmit/receive terminal. In the second transmit mode, the transmit signal is provided at a second power level, the transmit signal is coupled to a transmit/receive terminal using a second portion of the scalable impedance network having a second characteristic impedance looking from an input of the second portion toward the transmit/receive terminal. The second characteristic impedance is higher than the first characteristic impedance. In the receive mode, a signal from the transmit/receive terminal is received using all of the scalable impedance network.

FIG. 1 illustrates in schematic form a transceiver front-end circuit 100 known in the prior art. Receiver front-end circuit 100 includes an antenna 110, a transformer 120, a low noise amplifier (LNA) 130, and a power amplifier 140. Transformer 110 has a primary winding with a first end connected to antenna 110, and a second end connected to ground, and a secondary winding having first and second ends and a center tap connected to a power supply voltage terminal labeled "$V_{DD}$". $V_{DD}$ is positive with respect to ground and has a nominal voltage of, for example, 3.0 volts. LNA 130 has first and second input terminals connected to the first and second ends of the secondary winding of transformer 120, and first and second output terminals for providing a differential received signal having components labeled "$RF_{IN}{}^+$" and "$RF_{IN}{}^-$", respectively. Power amplifier 140 includes N-channel metal-oxide-semiconductor (MOS) transistors 142, 144, 146, and 148. Transistors 142 and 146 have a thick gate oxide and can tolerate higher voltage swings in their drains. Transistors 144 and 148 can be low-voltage devices with thinner gate oxides and smaller input capacitance. Transistor 142 has a drain connected to the second end of the secondary winding of transformer 120, a gate for receiving a voltage labeled "$V_{BIAS}$", and a source. Transistor 144 has a drain connected to the source of transistor 142, a gate for receiving a signal labeled "$RF_{OUT}{}^+$", and a source connected to ground. Transistor 146 has a drain connected to the first end of the secondary winding of transformer 120, a gate for receiving voltage $V_{BIAS}$, and a source. Transistor 148 has a drain connected to the source of transistor 146, a gate for receiving a signal labeled "$RF_{OUT}{}^-$", and a source connected to ground.

In operation, transceiver front-end circuit 100 operates in a receive mode and a transmit mode. In the receive mode, signals $RF_{OUT}{}^+$ and $RF_{OUT}{}^-$ are grounded. LNA 130 is operational and provides a differential signal between $RF_{IN}{}^+$ and $RF_{IN}{}^-$ to further receiver circuitry, not shown in FIG. 1. The further receiver circuitry includes circuits such as filters, mixers, amplifiers, demodulators, and the like which will vary based on the application. Transformer 120 provides single-ended to differential conversion and impedance transformation such that the impedance looking into the primary winding is commensurate with the transmitted power level.

In the transmit mode, receiver circuitry including LNA 130 is inactive, and power amplifier 140 is active. Power amplifier 140 receives and amplifies a differential signal between $RF_{OUT}{}^+$ and $RF_{Out}{}^+$ to provide a differential signal at a desired power level to transformer 120. Transistors 142 and 144 are cascode connected to provide isolation from the output (secondary winding of the transformer to the input $RF_{OUT}{}^+$ and $RF_{OUT}{}^-$ (in FIG. 1) and also to provide overvoltage protection. Power amplifier 140 provides an output signal to transformer 120 at a power level appropriate for the supported standard. For example, if power amplifier 140 supports the standard known as Zigbee, it provides an output power level at +20 dBm (decibels with respect to a power level of 1 milliwatt). If power amplifier 140 supports the standard known as Bluetooth, it provides an output power level at 0 dBm. The resistance looking into transformer 120, known as $R_P$, will also need to change based on the supported power level to maintain power efficiency.

For example, output power is given by Equation [1] below:

$$P_{DISS} = \frac{(2V_{DD})^2}{2R_P} \quad [1]$$

in which $R_P$ is the differential impedance seen by the power amplifier looking into transformer 120. For example, if $P_{DISS}$ is +20 dBm and $V_{DD}$=3 volts, then $R_P$=100Ω. This relationship implies that for a given value of power supply voltage $V_{DD}$, a higher transmit power requires a lower value for $R_P$.

However there are problems with this front-end architecture. First, a high value of $V_{DD}$ causes a larger input voltage swing on the inputs to LNA 130. For example if VDD=3 volts, the inputs of LNA 130 see a 6-volt peak-to-peak signal swing, which becomes a reliability problem because it can cause gate rupture when transceiver front-end circuit 100 is implemented using low voltage CMOS technology. Moreover it is not feasible to use high-voltage transistors in place of low-voltage CMOS transistors in the LNA because of their poor unity-gain current frequency ($F_t$) and consequently large input capacitance and poorer bandwidth at the internal cascode nodes.

Second, the noise figure (NF) of LNA 130 is given by the equation:

$$NF = \frac{1 + \frac{1}{G_m}}{R_P} \quad [2]$$

in which $G_m$ is the transconductance of LNA 130. Based on this equation for a given $G_m$, NF is inversely related to $R_P$ and to achieve a lower NF, $R_P$ needs to be higher. However this relationship creates a tradeoff in selecting a value for $R_P$ between higher transmit power (requiring smaller $R_P$) and lower NF for better reception quality (which requires larger $R_P$).

Third, different communication standards such as Zigbee and BTLE specify different transmit power levels. Thus selection of a value for $R_P$ (where $R_P$ is the impedance looking into the secondary winding of the transformer) for one transmit power level may degrade the power efficiency while operating a different transmit power level, for a given $V_{DD}$.

Figure 2:
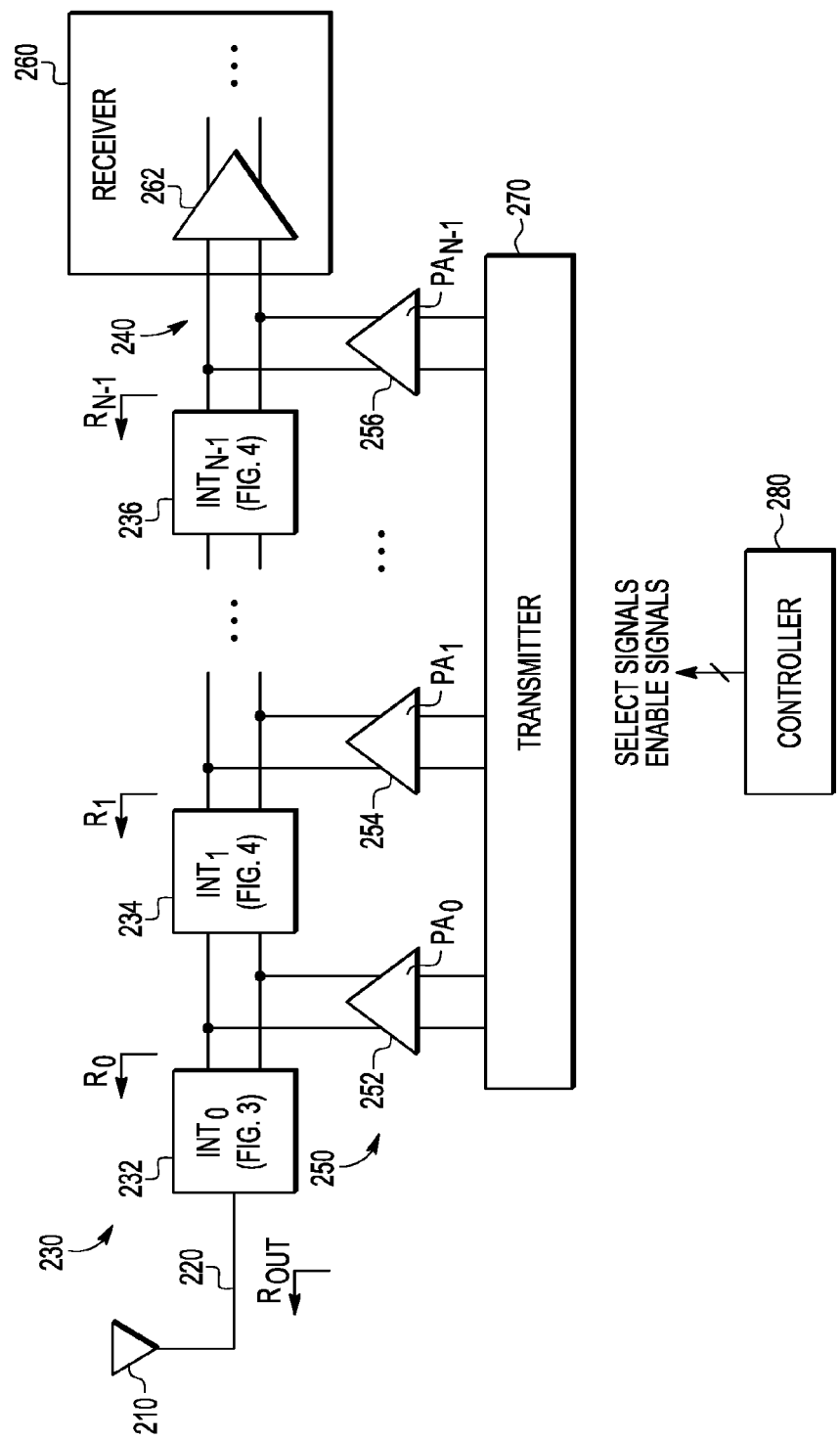
FIG. 2 illustrates in partial block diagram and partial schematic form a transceiver according to an embodiment of the present invention.

FIG. 2 illustrates in partial block diagram and partial schematic form a transceiver 200 according to an embodiment of the present invention. Transceiver 200 includes generally an antenna 210, transmit/receive terminal 220, a set of impedance transformation networks (ITNs) 230, a receiver input terminal 240, a set of power amplifiers 250, a receiver 260, a transmitter 270, and a controller 280. Antenna 210 is connected to transmit/receive terminal 220. Impedance transformation network 230 is connected between transmit/receive terminal 220 and receiver input terminal 240, and includes a set of N individual impedance transformation networks connected in series, of which representative ITNs 232, 234, and 236 labeled "$ITN_0$", "$ITN_1$", and "$ITN_{N-1}$", respectively, are shown in FIG. 2. Each ITN has a first port and a second port. The first port of ITN 232 is connected to transmit/receive terminal 220. The first port of ITN 234 is connected to the second port of ITN 232. Each ITN is connected in this pattern in series between transmit/receive terminal 220 and receiver input terminal 240 such that the second port of ITN 236 is connected to receiver input terminal 240. Power amplifiers 250 include N power amplifiers including a set of representative power amplifiers 252, 254, and 256 labeled "PA$_0$", "PA$_1$", and "PA$_{N-1}$", respectively, shown in FIG. 2. Power amplifiers 252, 254, and 256 have outputs connected to the second ports of impedance transformation networks 232, 234, and 236, respectively. Receiver 260 has an input connected to receiver input terminal 240. Shown in FIG. 2 is a representative circuit in receiver 260 in the form of an LNA 262, but receiver 260 includes additional circuits which are not shown in FIG. 2. Transmitter 270 has outputs connected to corresponding inputs of each of power amplifiers 250. Controller 280 has a set of control outputs including a set of select signals connected to each ITN to set a mode thereof, and a set of enable signals to enable other circuits in transceiver 200.

In operation, transceiver 200 provides transmission and reception of RF signals over a single transmit/receive terminal 220 using a common antenna 210. It operates in both a transmit mode and a receive mode.

In the transmit mode, transceiver 200 supports multiple sub-modes by selecting particular ones of power amplifiers 250 based on the selected power requirement. ITNs 230 form a scalable impedance network between transmit/receive terminal 220 and receiver input terminal 240. The second terminal of each ITN forms a tap in which an impedance looking into any given tap toward transmit/receive terminal 220 is smaller than an impedance looking into a subsequent tap, if any. For example as shown in FIG. 2, the impedance looking from the second port of ITN 232 toward transmit/receive terminal 220 is labeled "R$_0$" and is the lowest impedance; the impedance looking from the second port of ITN 234 toward transmit/receive terminal 220 is labeled "R$_1$" and is the second lowest impedance; and so on until the impedance looking from the second port of ITN 236 toward transmit/receive terminal 220 is labeled "R$_{N-1}$" and is the highest impedance. Power amplifiers 250 are arranged in an order such that the highest power amplifier is power amplifier 252, the next highest power amplifier is power amplifier 254, and so on until power amplifier 256, which outputs the lowest power. Power amplifiers 250 are connected to the taps of ITNs 230 such that the power of any given power amplifier is higher than a power of a subsequent power amplifier, if any, in the order.

Controller 280 provides a set of ENABLE SIGNALS to enable the power amplifier corresponding to the selected power specification, and disables the other power amplifiers. Controller 280 also provides a set of SELECT SIGNALS to place ITNs 234 through 236 into one of two modes based on the tap connected corresponding to the selected power amplifier. The first mode for ITNs 232-236 is known as the resonant mode in which the ITN adds a series impedance to the prior impedance. The second mode is known as the termination mode in which the ITN connects the terminals of its second port together to terminate the signal in the direction from transmit/receive terminal 220 toward receiver 260. Controller 280 provides the SELECT SIGNALS to place all "upstream" ITNs (i.e. toward antenna 210) in the resonant mode, and all "downstream" ITNs (i.e. away from antenna 210) in the termination mode. Thus in the transmit mode, controller 280 shorts the terminals of the second port of any downstream ITNs, eliminating the large signal swing on the input terminals of LNA 262.

In the receive mode, controller 280 provides all ENABLE SIGNALS in an inactive state. Controller 280 also provides all SELECT SIGNALS to select the resonant mode for all ITNs in ITNs 230.

Transceiver 200 solves the previously-mentioned problems associated with transceiver front-end circuit 100 of FIG. 1. First, it improves reliability by avoiding the large voltage swing at the input of LNA 262 using the termination mode for any downstream ITNs. Second, it avoids the tradeoff between power and NF by providing high input impedance R$_P$ in receive mode (thus lowering NF), but scalable output impedance in transmit mode based on the selected power requirement. Third, it supports multiple power output standards using a single transmit/receive terminal 220 and a common antenna 210 by using multiple power amplifiers connected to respective taps of a scalable impedance network.

The structures of ITNs that can be used for ITN 232, and ITNs 234 and 236, will now be described.

Figure 3:
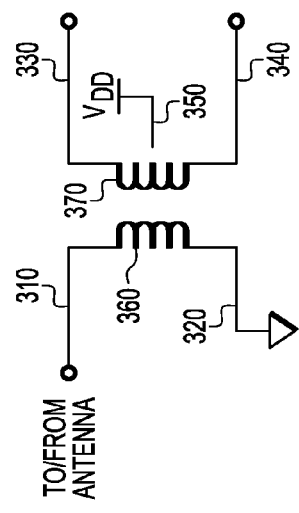
FIG. 3 illustrates in schematic form an impedance transformation network suitable for use as the first impedance transformation network of FIG. 2.

FIG. 3 illustrates in schematic form an impedance transformation network 300 suitable for use as the first impedance transformation network, ITN 232, of FIG. 2. Impedance transformation network 300 has a first port with first and second nodes 310 and 320, respectively, a second port having third and fourth nodes 330 and 340, respectively, and a bias terminal 350 connected to V$_{DD}$. Impedance transformation network 300 is implemented with a transformer in a balanced/unbalanced (BALUN) configuration in which the first terminal of the first port provides a single-ended transmit signal to or receives a single-ended receive signal from an antenna, and the second node 320 of the first port is connected to ground. Third node 330 and fourth node 340 of the second port provide a differential signal. The transformer has a primary winding 360 and a secondary winding 370. The turns ratio between primary winding 360 and secondary winding 370 can be 1:1 or higher (for example 1:2 or 1.4). The cost of implementing impedance transformation network 300 can be reduced by integrating the off-chip transformer using corresponding on-chip magnetically coupled inductors available in contemporary CMOS manufacturing processes. Note that ITN 300 is always used in both the transmit mode and the receive mode and so does not require a SELECT SIGNAL to alter its mode.

Figure 4:
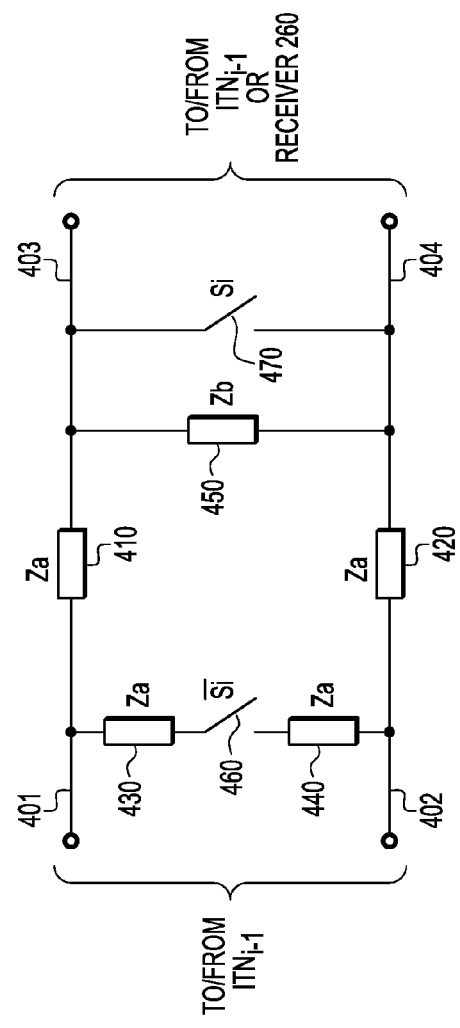
FIG. 4 illustrates in partial block diagram and partial schematic form an impedance transformation network suitable for use as the second or any subsequent impedance transformation network of FIG. 2.

FIG. 4 illustrates in partial block diagram and partial schematic form an impedance transformation network 400 suitable for use as the second or any subsequent impedance transformation network (ITNs 234 and 236) of FIG. 2. Impedance transformation network 400 has a first port having first and second nodes 401 and 402, respectively, and a second port having third and fourth nodes 403 and 404, respectively. If impedance transformation network is the i$^{th}$ impedance transformation network in the sequence, then the first port is connected to the second port of ITN$_{i-1}$, and the second port is connected to the first port of ITN$_{i+1}$, if any.

Impedance transformation network 400 further includes impedance elements 410, 420, 430, 440, and 450, and switches 460 and 470. Impedance element 410 is connected between node 401 and node 403 and has an impedance labeled "Z$_a$". Impedance element 420 is connected between node 402 and node 404 and has impedance Z$_a$. Impedance element 430 has a first terminal connected to node 401, and a second terminal and has impedance Z$_a$. Impedance element 440 has a first terminal, and a second terminal connected to node 402, and has impedance Z$_a$. Impedance element 450 is connected between nodes 403 and 404 and has an impedance labeled "$Z_b$". Switch 460 has a first terminal connected to the second terminal of impedance element 430, a second terminal connected to the first terminal of impedance element 440, and a control terminal for receiving a control signal labeled "$\overline{S_i}$". Switch 470 has a first terminal connected to node 403, a second terminal connected to node 404, and a control terminal for receiving a control signal labeled "$S_i$", in which control signal $\overline{S_i}$ is a complement of control signal $S_i$.

Impedance transformation network 400 operates in the resonant mode when $S_i$=0 and $\overline{S_i}$=1, and in the termination mode when $S_1$=1 and $\overline{S_i}$=0. In the resonant mode, switch 460 is closed and switch 470 is open. In the termination mode, switch 460 is open and switch 470 is closed, nodes 403 and 404 are shorted together, and the impedance looking into the first port is equal to $2Z_a$. In one embodiment, impedance elements 410, 420, 430, and 440 are capacitors while impedance element 450 is an inductor. In an alternative embodiment, impedance elements 410, 420, 430, and 440 are inductors while impedance element 450 is a capacitor.

Figure 5:
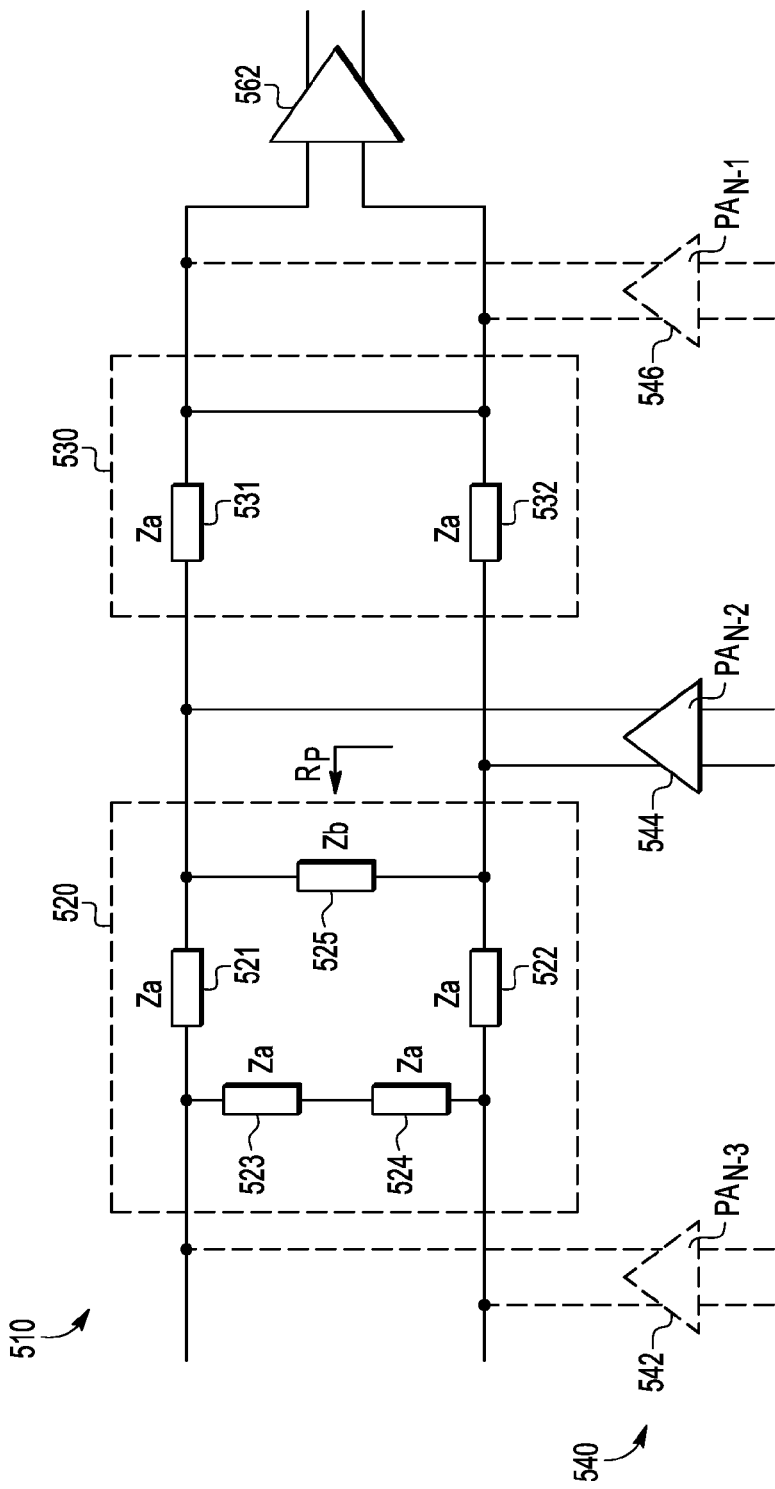
FIG. 5 illustrates in partial block diagram and partial schematic form a portion of the transceiver of FIG. 2 configured for the transmit mode.

FIG. 5 illustrates in partial block diagram and partial schematic form a portion 500 of the transceiver 200 of FIG. 2 configured for the transmit mode. Portion 500 includes a set of impedance transformation networks 510, a set of power amplifiers 540, and an LNA 562. Impedance transformation networks 510 include a first ITN 520 and a second ITN 530 in which a first port of ITN 520 is connected to a second port of an upstream ITN (not shown in FIG. 5), a first port of ITN 530 is connected to a second port of ITN 520, and a second port of ITN 530 is connected to an input of LNA 562. Power amplifiers 540 include three power amplifiers including power amplifiers 542, 544, and 546 labeled "$PA_{N-3}$", "$PA_{N-2}$", and "$PA_{N-1}$", respectively. Power amplifier 542 has outputs connected to the second port of an upstream ITN (not shown in FIG. 5). Power amplifiers 544 and 546 have outputs connected to the second ports of ITNs 520 and 530, respectively.

As shown in FIG. 5, the transceiver is configured to support a power output level corresponding to power amplifier 544, and controller 280 disables power amplifiers 542 and 546 (indicated by dashed lines) by inactivating their corresponding ENABLE SIGNALS. Controller 280 enables power amplifier 544, and configures upstream ITN 520 in the resonant mode and downstream ITN 520 in the termination mode. FIG. 5 illustrates ITNs 520 and 530 with impedance elements as they are configured for this example. Thus ITN 520 is illustrated with impedance elements 521-525, whereas ITN 530 is illustrated with only impedance elements 531 and 532. As shown in FIG. 5, power amplifier 544 sees a downstream path terminated to an impedance equal to $2Z_a$, and an upstream path having an effective impedance $R_P$. Note also in the transmit mode, the second terminals of impedance elements 531 and 532 are shorted together, and thus LNA 562 sees no harmful voltage swing.

Note that FIGS. 2 and 5 illustrate a transceiver supporting N different power levels, in which N is an arbitrary integer greater than or equal to 2. In some particularly useful embodiments, N is equal to 2, and this configuration will now be shown.

Figure 6:
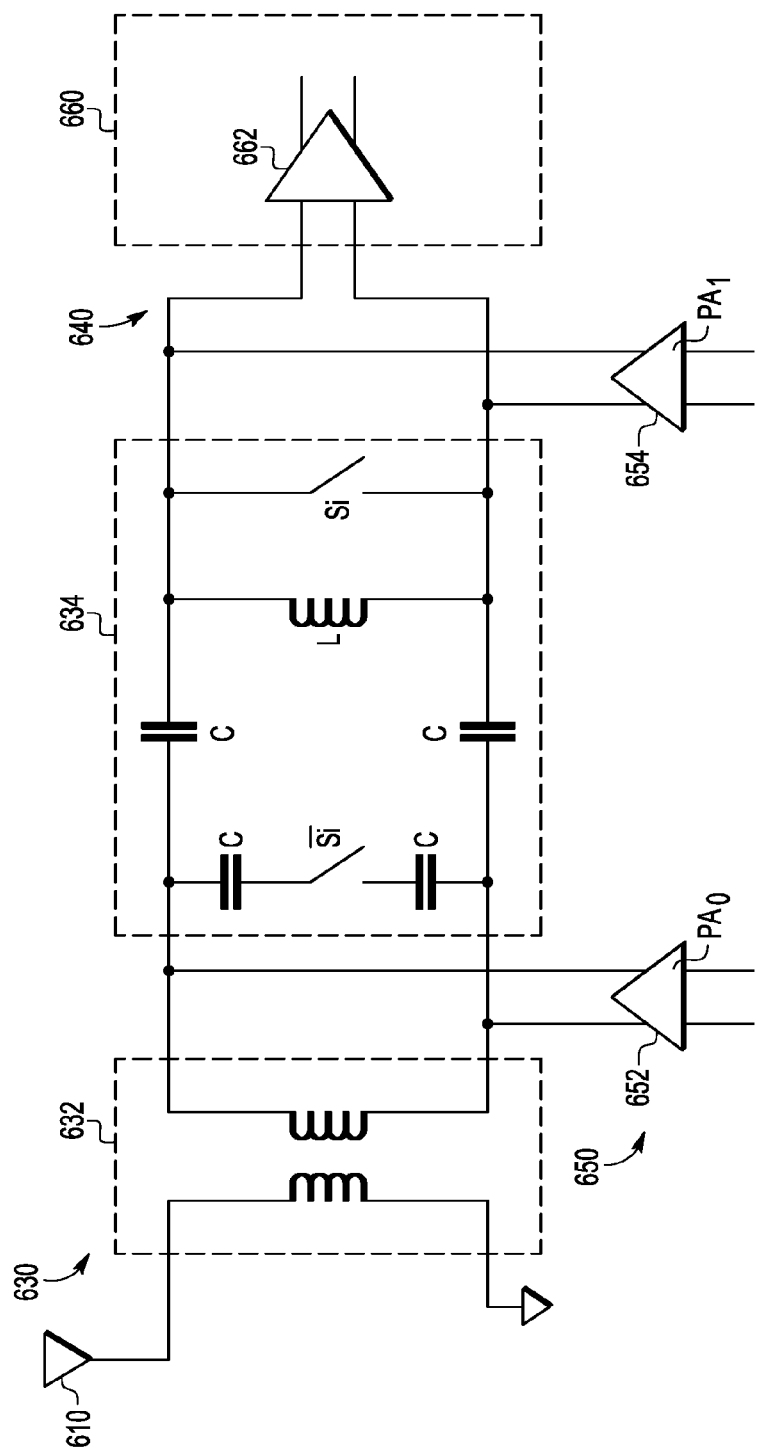
FIG. 6 illustrates in partial block diagram and partial schematic form a portion of a transceiver implementing the transceiver of FIG. 2 for the case of N=2.

FIG. 6 illustrates in partial block diagram and partial schematic form a portion of a transceiver 600 implementing transceiver 200 of FIG. 2 for the case of N=2. Transceiver 600 includes an antenna 610 connected to a transmit/receive terminal 620 and includes a set of ITNs 630 forming a scalable impedance transformation network connected between transmit/receive terminal 620 and a receiver input terminal 640. Transceiver 600 also includes a set of power amplifiers 650 and a receiver 660 having an LNA 662 connected to receiver input terminal 640. ITNs 630 include an ITN 632 in the form of a transformer in the BALUN configuration, and an ITN 634. Transformer 632 has a first port having a first node connected to transmit/receive terminal 620 and a second node connected to ground, and a second port having a third node and a fourth node. Transformer 632 has a first winding connected between the first and second nodes, and a second winding connected between the third and fourth nodes. ITN 632 is always used regardless of the mode, and thus receives no SELECT SIGNAL. ITN 634 has a set of capacitors and an inductor, in which the capacitors have the same capacitance value C and the inductor has an inductance value L. A first switch controlled by a SELECT SIGNAL labeled "$\overline{S_1}$" opens and closes to selectively connect two capacitors between the first and second nodes of ITN 634, and a second switch controlled by a SELECT SIGNAL labeled "$S_1$" that opens and closes to short the third and fourth nodes of ITN 634. A first power amplifier 652 labeled "$PA_0$" has outputs connected to the second port of ITN 632, and a second power amplifier 654 labeled "$PA_1$" has outputs connected to the second port of ITN 634. In a first transmit mode requiring higher power, such as +20 dBm required by the Zigbee standard, $PA_0$ is enabled and $PA_1$ is disabled, signal $\overline{S_1}$ is low, and signal $S_1$ is high. In a second transmit mode requiring lower power, such as 0 dBm required by the BTLE standard, $PA_0$ is disabled and $PA_1$ is enabled, signal $\overline{S_1}$ is high, and signal $S_1$ is low, causing ITN 634 to operate in the resonant mode.

Thus a transceiver has been described that operates using a scalable impedance transformation network that in a transmit mode allows multiple transmit power levels but in a receive mode sees relatively high impedance for good NF. In addition it operates reliably when fabricated using low voltage CMOS manufacturing processes by reducing or eliminating the voltage swing on the receiver input during transmit mode. Moreover all components except the antenna can be implemented cheaply on a single integrated circuit using available low voltage CMOS manufacturing processes.

The above-disclosed subject matter is to be considered illustrative, and not restrictive, and the appended claims are intended to cover all such modifications, enhancements, and other embodiments that fall within the true scope of the claims. For example, a transceiver can be built according to the principles described above for an arbitrary number N of different power levels, in which N is an integer greater than or equal to 2. Moreover the impedance transformation networks can have impedances that vary according to the supported power levels and can be implemented using capacitors and inductors fabricated on a single integrated circuit die, or with two die using integrated passive device techniques and mounted in the same integrated circuit package. The input circuit of the receiver can be a LNA as shown, or another circuit such as a mixer. The power amplifiers, switches, LNAs, mixers, and other active circuit components can be made using different transistor types, such as N-channel MOS transistors, P-channel MOS transistors, or various combinations of the two.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A transceiver comprising:
   a transmit/receive terminal;
   a receiver input terminal;
   a plurality of impedance transformation networks coupled in series, each having a first port and a second port wherein said first port of a first impedance transformation network is coupled to said transmit/receive terminal and said second port of a last impedance transformation network is coupled to said receiver input terminal, said plurality of impedance transformation networks including at least one selectable impedance transformation network having a resonant mode and a termination mode;
   a plurality of power amplifiers having outputs respectively coupled to said second ports of corresponding ones of said plurality of impedance transformation networks; and
   a controller that in a receive mode selects said resonant mode for each of said at least one selectable impedance transformation network and disables all of said plurality of power amplifiers, and in a transmit mode enables a selected one of said plurality of power amplifiers and selects said resonant mode of any of said at least one selectable impedance transformation network coupled between an output of said selected one of said plurality of power amplifiers and said transmit/receive terminal, and selects said termination mode of a first of said at least one selectable impedance transformation network coupled between an output of said selected one of said plurality of power amplifiers and said receiver input terminal.

2. The transceiver of claim 1, wherein each selectively enabled impedance transformation network comprises:
   a first node, a second node, a third node, and a fourth node node;
   a first impedance element coupled between said first and third nodes;
   a second impedance element coupled between said second and fourth nodes;
   a third impedance element having a first terminal coupled to said first node, and a second terminal;
   a fourth impedance element having a first terminal, and a second terminal coupled to said second node;
   a fifth impedance element coupled between said third and fourth nodes;
   a first switch for coupling said second terminal of said third impedance element to said first terminal of said fourth impedance element in response to a complement of a select signal; and
   a second switch for coupling said third node to said fourth node in response to said select signal.

3. The transceiver of claim 2, wherein said first, second, third, and fourth impedance elements comprise capacitors, and said fifth impedance element comprises an inductor.

4. The transceiver of claim 2, wherein said first, second, third, and fourth impedance elements comprise inductors, and said fifth impedance element comprises a capacitor.

5. The transceiver of claim 1, wherein said first impedance transformation network comprises a balanced/unbalanced transformer.

6. The transceiver of claim 5, wherein said plurality of impedance transformation networks, said plurality of power amplifiers, and said controller are combined onto a single integrated circuit.

7. The transceiver of claim 1, wherein each of said plurality of impedance transformation networks has larger characteristic impedance than a previous one of said plurality of impedance transformation networks, if any, in said series.

8. The transceiver of claim 7, wherein a first power amplifier coupled to said second port of said first impedance transformation network outputs a higher power level than a second power amplifier coupled to said second port of a second impedance transformation network subsequent to said first impedance transformation network in said series.

9. The transceiver of claim 1, further comprising:
   a receiver coupled to said receiver input terminal; and
   a transmitter coupled to inputs of said plurality of selectively enabled power amplifiers.

10. The transceiver of claim 9, wherein said receiver comprises a low noise amplifier having inputs coupled to said receiver input terminal.

11. The transceiver of claim 9, wherein said receiver comprises a mixer having inputs coupled to said receiver input terminal.

12. A transceiver comprising:
    a terminal;
    a plurality of impedance transformation networks forming a scalable impedance transformation network comprising:
        a first impedance transformation network having a first port coupled to said terminal and a second port; and
        a second impedance transformation network having a first port coupled to said second port of said first impedance transformation network, and a second port and having a resonant mode and a termination mode;
    a plurality of power amplifiers comprising:
        a first power amplifier coupled to said second port of said first impedance transformation network; and
        a second power amplifier coupled to said second port of said second impedance transformation network; and
    a controller that:
        in a first transmit mode provides a transmit signal to said terminal using said first power amplifier while placing said second impedance transformation network in said termination mode; and
        in a second transmit mode provides said transmit signal to said terminal using said second power amplifier while placing said second impedance transformation network in said resonant mode.

13. The transceiver of claim 12, wherein said second impedance transformation network has larger characteristic impedance than said first impedance transformation network, and said first power amplifier outputs a higher power level than said second power amplifier.

14. The transceiver of claim 12 wherein said terminal comprises a transmit/receive terminal, and said transceiver further comprises:
    a receiver coupled to said second port of said second impedance transformation network,
    wherein in a receive mode said controller disables all of said plurality of power amplifiers and selects said resonant mode for said second impedance transformation network.

15. The transceiver of claim 12 wherein:
    said plurality of impedance transformation networks further comprises a third impedance transformation network having a first port coupled to said second port of said second impedance transformation network, and a second port, and having said resonant mode and said termination mode; and said plurality of power amplifiers further comprises a third power amplifier coupled to said second port of said third impedance transformation network,
wherein:
in said second transmit mode said controller further places said third impedance transformation network in said termination mode; and
in a third transmit mode said controller provides said transmit signal to said terminal using said third power amplifier while placing said second and third impedance transformation networks in said resonant mode.

16. The transceiver of claim 15, wherein said second impedance transformation network has larger characteristic impedance than said first impedance transformation network and said third impedance transformation network has larger characteristic impedance than said second impedance transformation network, and said first power amplifier outputs a higher power level than said second power amplifier, and said second power amplifier outputs a higher power level than said third power amplifier.

17. A method comprising:
in a first transmit mode:
providing a transmit signal at a first power level; and
coupling said transmit signal to a transmit/receive terminal using a first portion of a scalable impedance network having a first characteristic impedance looking from an input of said first portion toward said transmit/receive terminal, in a second transmit mode:
providing said transmit signal at a second power level; and
coupling said transmit signal to said transmit/receive terminal using a second portion of said scalable impedance network having a second characteristic impedance looking from an input of said second portion toward said transmit/receive terminal, wherein said second characteristic impedance is higher than said first characteristic impedance, and
in a receive mode:
receiving a signal from said transmit/receive terminal using all of said scalable impedance network.

18. The method of claim 17 comprising:
in either said first transmit mode or said second transmit mode:
terminating said transmit signal looking from an input of said first and second portions toward a receiver input terminal.

19. The method of claim 18 further comprising:
in either said first transmit mode or said second transmit mode:
shorting first and second differential inputs of said receiver input terminal.

20. The method of claim 17 further comprising:
in said receive mode:
converting a voltage at a receiver input terminal into a current.

* * * * *